(12) United States Patent
Arguello

(10) Patent No.: US 7,843,231 B2
(45) Date of Patent: Nov. 30, 2010

(54) TEMPERATURE-COMPENSATED VOLTAGE COMPARATOR

(75) Inventor: Angel Maria Gomez Arguello, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 39 days.

(21) Appl. No.: 12/426,585

(22) Filed: Apr. 20, 2009

(65) Prior Publication Data
US 2010/0264980 A1   Oct. 21, 2010

(51) Int. Cl.
*H03K 5/22* (2006.01)
(52) U.S. Cl. .............................. 327/63; 327/89; 327/83; 327/513
(58) Field of Classification Search ............. 327/63–68, 327/77, 83, 89, 512–513
See application file for complete search history.

(56) References Cited

U.S. PATENT DOCUMENTS

| 3,569,736 | A | 3/1971 | Tschinkel |
| 4,604,532 | A | 8/1986 | Gilbert |
| 5,365,129 | A | 11/1994 | Slemmer et al. |
| 2002/0027469 | A1* | 3/2002 | Eagar et al. .................. 327/539 |

OTHER PUBLICATIONS

Gilbert, B., "Translinear Circuits: A Proposed Classification", IEEE Electronics Letters, 9th Jan. 1975, pp. 14-16, vol. 11, No. 1.

* cited by examiner

*Primary Examiner*—Quan Tra

(57) ABSTRACT

A temperature-compensated voltage comparator (301) that compares first and second input voltages includes first and second bipolar junction transistors (BJTs) (221 and 222) that convert the first and second input voltages to first and second input currents, respectively. The first and second BJTs share a same thermal environment and their currents are dependent upon temperature. A temperature-compensating circuit (350), which includes a zero thermal coefficient reference (419), generates a logarithmic temperature-compensating factor that compensates for temperature dependency of the first and second BJTs. The temperature-compensating circuit receives one of the input currents, and outputs a temperature-compensated current that is said input current multiplied by the logarithmic temperature-compensating factor. The temperature-compensating circuit shares a thermal environment with the first and second BJTs. An output voltage is indicative of a differential between the first input voltage and the second input voltage, such that a threshold of the comparator is substantially temperature independent.

20 Claims, 5 Drawing Sheets

TEMPERATURE-COMPENSATED VOLTAGE COMPARATOR

BACKGROUND OF THE INVENTION

1. Field of the Invention

This invention relates generally to voltage comparators, and more specifically to reducing the temperature dependence of a differential voltage comparator.

2. Related Art

FIG. 1 shows a prior art differential voltage comparator 101 used in a current-sensing application in conjunction with a buck converter 103, or step-down DC-to-DC converter, which is a type of switching regulator. In the buck converter 103, a peak current circulating through an external power field-effect transistor (FET) 104 is measured by a small value, high precision, current sense resistor 105, whose resistance varies very little with temperature. The precision of the current sense resistor 105 can be as high as ±0.5%. The value of the peak current is then compared to a fixed reference, thereby limiting a maximum peak current. The value of the differential voltage over the current sense resistor 105 is typically approximately 10-40 mV. The differential voltage comparator 101 comprises an input terminal 111, an input terminal 112 and an output terminal 113. The differential voltage comparator 101 measures a difference between analog voltages $V_p$ and $V_m$ that appear across the current sense resistor 105, which are also present at input terminals 111 and 112, respectively. The differential voltage comparator 101 produces a digital output $V_{out}$ at the output terminal 113. The differential voltage comparator 101 of FIG. 1, which represents one possible implementation of a differential voltage comparator, comprises a first operational amplifier 115 and a second operational amplifier 116. The trip point, or threshold of comparison, of a differential voltage comparator is a voltage, $V_p-V_m$, at which the output $V_{out}$ of the differential voltage comparator changes from high to low, or vice versa. Because of a voltage offset within the first operational amplifier 115, a voltage offset within the second operational amplifier 116 and a mismatch of the resistors 117 and 118, there is a lower limit on the value of the threshold of the differential voltage comparator 101. Differential voltage comparators that are typically found in analog integrated circuits have an internal offset that has a magnitude of approximately 5 mV or approximately 10 mV, and they need a special arrangement to compare a differential voltage with an external fixed reference voltage such as a bandgap voltage, $V_{ref}$ 119.

A differential voltage translinear comparator (hereinafter "translinear comparator") may be able to operate at a lower threshold than the differential voltage comparator 101. A translinear comparator uses an intrinsic reference that is internal to, and inherent in, the bipolar junction transistors within the translinear comparator. The intrinsic reference is a characteristic voltage of a bipolar junction transistor related to its thermal voltage $V_T$. The relationship between the flow of electrical current and the electrostatic potential across a PN junction depends on the thermal voltage $V_T$, such that $$V_T = kT/q$$

where T is the temperature of the PN junction measured in degrees Kelvin, and q is the magnitude of the electrical charge on an electron ($1.602 \times 10^{-19}$ Coulombs). The Boltzmann's constant, k, can be expressed as $1.3806 \times 10^{-23}$ Joules/degree Kelvin. The thermal voltage $V_T$, and, therefore, the value of the intrinsic reference of a translinear comparator, varies directly proportionately with temperature. Such variation adversely affects the precision of any comparison made by a translinear comparator. The thermal voltage, $V_T$ is approximately 25.85 mV at room temperature (approximately 300° K.).

A translinear comparator follows the following relation:

$$V_{out} = \begin{cases} 0, & \text{if}(V_p - V_m) < aT * \ln(b) \\ 1, & \text{if}(V_p - V_m) > aT * \ln(b) \end{cases} \qquad \text{Equation (1)}$$

where 'a' is a universal physical constant; 'b' is a constant, such as a ratio defined by sizes of components within the translinear comparator; and T is the junction temperature of transistors measured in degrees Kelvin. As can be observed from Equation (1), the value of the differential voltage, $V_p-V_m$, varies with temperature, which means that the threshold of comparison disadvantageously varies with temperature.

FIG. 2 shows a prior art translinear comparator 201. The translinear comparator 201 compares the differential voltage over the sense resistor 105 (see FIG. 1) with the internal intrinsic reference of the translinear comparator 201. The differential voltage translinear comparator 201 includes input terminals 211 and 212 and output terminal 213. The translinear comparator 201 comprises a PNP bipolar junction transistor $Q_p$ 221 and a PNP bipolar junction transistor $Q_m$ 222. The emitter of transistor $Q_p$ 221 is coupled to terminal 211. The emitter of transistor $Q_m$ 222 is coupled to terminal 212. The base of transistor $Q_p$ 221 is coupled to the base of transistor $Q_m$ 222. The translinear comparator 201 further comprises transistors M0 230 and M1 231, which are arranged in a current-mirror configuration, and transistors M4 234 and M1 235, which are also arranged in a current-mirror configuration. The collector of transistor $Q_p$ 221 is coupled to transistor M0 230. The collector of transistor $Q_m$ 222 is coupled to transistor M4 234. The translinear comparator 201 further comprises transistors M2 232 and M3 233, which are arranged in a current-mirror configuration. The source of M2 232 is coupled to the source of M3 233. The translinear comparator 201 includes a power supply having a voltage $V_{in}$ 241. A bias voltage $V_{bias}$ 243 biases the base of bipolar transistors $Q_p$ 221 and $Q_m$ 222. Disadvantageously, the translinear comparator 201 is temperature dependent. The translinear comparator 201 measures a difference between a voltage $V_p$ at input terminal 211 and a voltage $V_m$ at input terminal 212. The translinear comparator 201 senses a differential input and asserts high a flag, $V_{out}$, at output terminal 213 when the differential voltage between the inputs $V_m$ and $V_p$ is larger than a predetermined threshold of comparison.

By applying Kirchhoff's voltage law, it is possible to find the following equation for the input translinear loop comprising ($V_p-V_m$), $Q_p$ and $Q_m$ for the translinear comparator 201:

$$V_p-V_m = V_{ebQp}-V_{ebQm} = V_T * \ln(I_p/I_{sp}) - V_T * \ln(I_m/I_{sm}),$$
Equation (2)

where $V_{ebQp}$ is the emitter-base voltage of transistor $Q_p$; $V_{ebQm}$ is the emitter-base voltage of transistor $Q_m$; $I_p$ is the current through $Q_p$; $I_m$ is the current through $Q_m$; and where $I_{sp}$ and $I_{sm}$ are constant currents used to describe the characteristics of the transistor $Q_p$ and $Q_m$, respectively, in the saturation region and are directly proportional to the junction area of the respective transistor. By applying algebraic and logarithmic identities, Equation (2) can be re-written as $$V_p-V_m = V_T * [\ln(I_p/I_{sp}) - \ln(I_m/I_{sm})]$$

$$V_p-V_m = V_T * \ln[(I_p/I_{sp}) * (I_{sm}/I_m)]$$

$$V_p-V_m = V_T * \ln[(I_p/I_m) * (I_{sm}/I_{sp})]$$

Assuming that the ratio of all current mirrors (M0/M1, M2/M3 and M4/M5) is 1:1, and if the junction area of transistor $Q_m$ is four (4) times the junction area of transistor $Q_p$, then $I_{sm}$ becomes equal to $4I_{sp}$. However, regardless of the ratio in the junction areas of the transistors, $I_p$ will be equal to $I_m$ at the threshold of comparison. Therefore, at the threshold of comparison, the preceding equation becomes:

$$V_p - V_m = V_T * \ln[(1)*(4)] \approx 36 \text{ mV at } 300° \text{ K}.$$

The voltage of the threshold of comparison of the prior art translinear comparator 201 can be selected by preselecting a value for 'b'. However, because $V_T$ varies directly proportionately with temperature, the threshold of comparison of the prior art translinear comparator 201 disadvantageously varies with temperature. According to equation (1), the threshold of comparison is $aT*\ln(b)$. That is, $$V_p - V_m = aT*\ln(b) \qquad \text{Equation (3)}$$

where T is the temperature measured in degrees Kelvin, and, for the translinear comparator 201, 'b' is a constant. Specifically, for the translinear comparator 201, 'b' is a ratio 'r' of the junction area of $Q_m$ to the junction area of $Q_p$. The ratio 'r' is typically selected as four (4) so that the threshold of comparison for the translinear comparator 201 becomes approximately 36 mV, which is near the upper end of the range of 0-40 mV expected across the sense resistor 105. By combining Equation (2), Equation (3) and the known relationship $V_T = kT/q$, it can be shown that $a = k/q \approx 8.66 \times 10^{-2}$ mV/degree Kelvin. Therefore, for the translinear comparator 201, when b=4, Equation (3) becomes $$V_p - V_m = (8.66 \times 10^{-2})*T*\ln(4) = (8.66 \times 10^{-2})*T*(1.386294361) = T*0.12 \text{ mV}$$

Considering that a typical variation of temperature for industrial applications is from −50° C. to 150° C. (223° K. to 423° K.), the preceding equation shows that the threshold of comparison for the prior art translinear comparator 201 can vary from 26.77 mV to 50.78 mV, or ±31%, which is a disadvantageously large variation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF EXEMPLARY EMBODIMENTS

Figure 3:
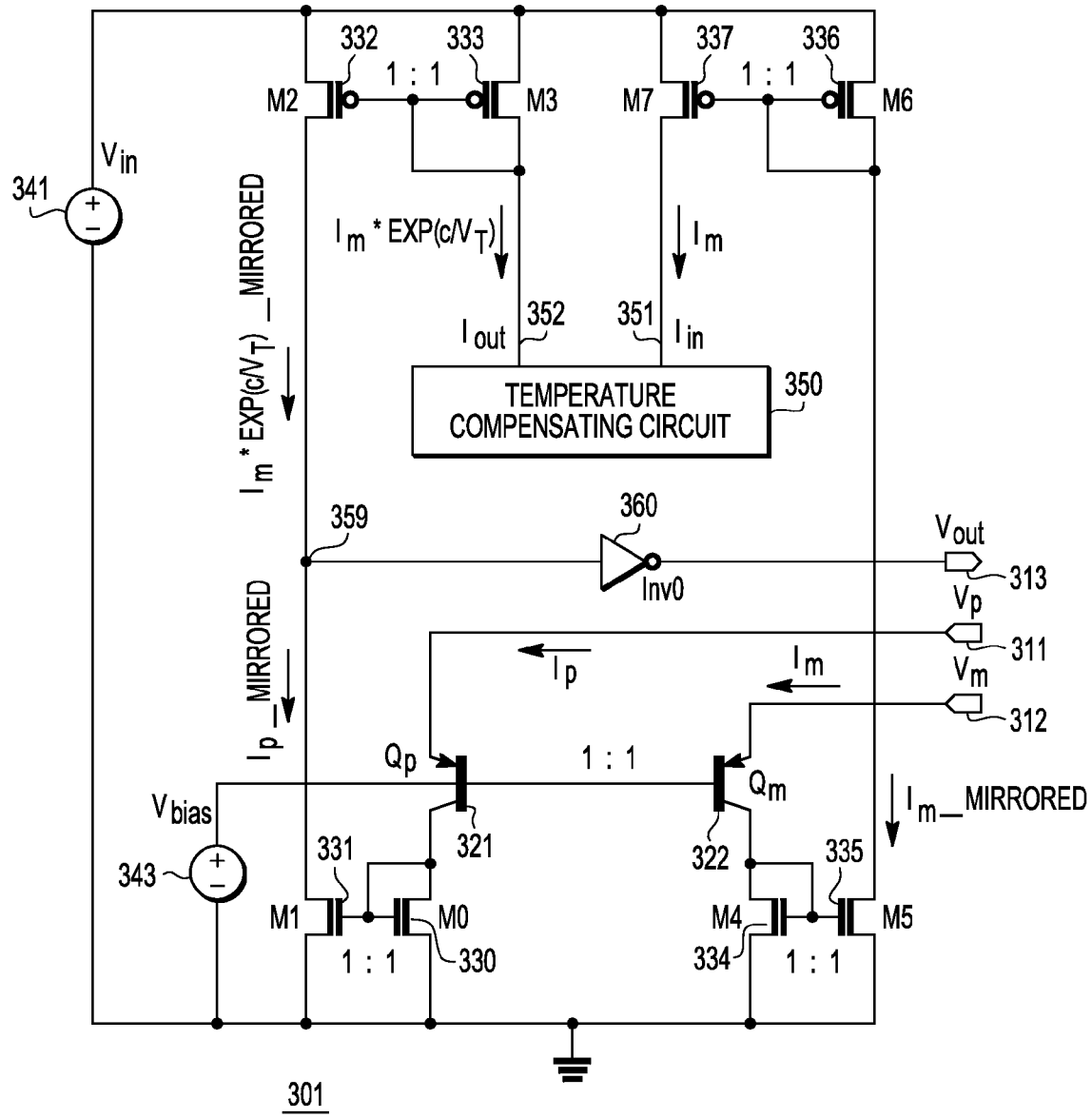
FIG. 3 is a schematic diagram of a temperature-compensated voltage comparator in accordance with an embodiment of the invention, which includes a temperature-compensating circuit.

FIG. 3 is a schematic diagram of a temperature-compensated voltage comparator 301 in accordance with an embodiment of the invention. The temperature-compensated voltage comparator 301 comprises input terminals 311 and 312 and output terminal 313. The temperature-compensated voltage comparator 301 also comprises input transistors $Q_p$ 321 and $Q_m$ 322. In an exemplary embodiment, input transistors $Q_p$ 321 and $Q_m$ 322 are PNP bipolar junction transistors. The input transistors $Q_p$ 321 and $Q_m$ 322 share a same thermal environment. The input transistors $Q_p$ 321 and $Q_m$ 322 are located as close to each other as possible on a substrate of an integrated circuit so that any process variations that may occur during fabrication of the integrated circuit would affect both transistors in a same way. The emitter of input transistor $Q_p$ 321 is coupled to input terminal 311. The emitter of input transistor $Q_m$ 322 is coupled to input terminal 312. The base of input transistor $Q_p$ 321 is coupled to the base of input transistor $Q_m$ 322. The temperature-compensated voltage comparator 301 further comprises N-channel transistor M0 330 and N-channel output transistor M1 331 that are arranged in a first current-mirror configuration, wherein their gates are coupled together. The temperature-compensated voltage comparator 301 also comprises N-channel transistors M4 334 and M5 335, which are arranged in a second current-mirror configuration, wherein their gates are coupled together. The collector of input transistor $Q_p$ 321 is coupled to the drain of transistor M0 330. The collector of input transistor $Q_m$ 322 is coupled to the drain of transistor M4 334. The temperature-compensated voltage comparator 301 further comprises P-channel transistors M6 336 and M7 337, arranged in a third current-mirror configuration in which the gates of each transistor are coupled together. The temperature-compensated voltage comparator 301 further comprises P-channel output transistor M2 332 and P-channel transistor M3 333, arranged in a fourth current-mirror configuration in which the gates of each transistor are coupled together. The ratio of all current mirrors (M0/M1, M2/M3, M4/M5 and M6/M7) is 1:1. The drain of M2 332 is coupled to the drain of M1 331, and the drain of M6 336 is coupled to the drain of M5 335. In an exemplary embodiment, transistors M0 330, M1 331, M2 332, M3 333, M4 334, M5 335, M6 336 and M7 337 are field-effect transistors (FETs). The temperature-compensated voltage comparator 301 includes a power supply having a voltage $V_{in}$ 341. In an exemplary embodiment, the value of $V_{in}$ 341 is approximately 3.6V. A bias voltage $V_{bias}$ 343 is used to bias the base of input transistors $Q_p$ 321 and $Q_m$ 322. In an exemplary embodiment, the value of $V_{bias}$ 343 is approximately equal to the value of $V_p$ minus the voltage drop over a diode.

The temperature-compensated voltage comparator 301 measures a difference between a voltage $V_p$ at input terminal 311 and a voltage $V_m$ at input terminal 312. In an exemplary application, the voltage, $V_p - V_m$, is a voltage across the current sense resistor 105 of a switching regulator such as the buck converter 103 shown in FIG. 1. The differential voltage, $V_p - V_m$, is analog. The differential voltage can have an infinite number of values, ranging from zero to whatever value is defined by external components, such as the components of the buck converter 103. The output voltage $V_{out}$ of the temperature-compensated voltage comparator 301 is digital. The output voltage $V_{out}$ can take one of two values: logical "0" corresponding to ground of the circuit, and logical "1" corresponding to the voltage of a power supply of the circuit, $V_{in}$ 341. The temperature-compensated voltage comparator 301 asserts high a flag at output terminal 313 when the differential voltage between the input voltages, $V_p$ and $V_m$, is larger than a threshold of comparison (hereinafter "threshold"). When the voltage difference, $V_p-V_m$, is larger than the threshold, $V_{out}$ is high, i.e., logical "1" or approximately 3.6V. When the voltage difference, $V_p-V_m$, is smaller than the threshold, $V_{out}$ is low, i.e., logical "0" or approximately 0V.

The temperature-compensated voltage comparator 301 follows the following relation:

$$V_{out} = \begin{cases} 0, & \text{if}(V_p - V_m) < aT*\ln(b) \\ 1, & \text{if}(V_p - V_m) > aT*\ln(b) \end{cases}$$

where 'a' is a universal physical constant (a=k/q=8.66×10$^{-2}$ mV/degree Kelvin); 'b' is a function dependent on temperature, and T is the junction temperature of transistors measured in degrees Kelvin. Using translinear loops, the temperature-compensated voltage comparator 301 generates an output voltage $V_{out}$ that does not have any dependency on temperature. In the temperature-compensated voltage comparator 301, the properties of translinear loops are used to make the 'b' in Equation (1) not a simple constant (as in the prior art translinear comparator 201), but an expression in the form $e^{c/(aT)}$, where 'e' is Euler's constant (approximately 2.71828). If 'c' is independent of temperature, then the threshold of the temperature-compensated voltage comparator 301 will also be independent of temperature.

It can be seen from Equation (1) that the threshold of the temperature-compensated voltage comparator 301 is aT*ln (b). The temperature-compensated voltage comparator 301 includes a temperature-compensating circuit 350. The temperature-compensating circuit 350 generates a temperature-compensating factor b=$e^{c/(aT)}$=exp[c/(aT)], where 'c' is a constant independent of temperature. In this way, the threshold of the temperature-compensated voltage comparator 301 becomes $$aT*[\ln e^{c/(aT)}] = aT*[c/(aT)] = c$$

In other words, the temperature-compensating circuit 350 cancels, or counteracts, the T term of Equation (1) above, thereby advantageously making the threshold of the temperature-compensated voltage comparator 301 independent of temperature. The temperature-compensating circuit 350 shares a same thermal environment as the input transistors $Q_p$ 321 and $Q_m$ 322.

As a result, $V_{out}$ of the temperature-compensated voltage comparator 301 follows the relation:

$$V_{out} = \begin{cases} 0, & \text{if}(V_p - V_m) < c \\ 1, & \text{if}(V_p - V_m) > c \end{cases} \quad \text{Equation(4)}$$

Consequently, not only is the threshold of the temperature-compensated voltage comparator 301 a constant with respect to temperature, but also the value of this constant is generated within the temperature-compensating circuit 350. In other words, with the temperature-compensated voltage comparator 301, the threshold is equal to 'c'.

Voltages at the input terminals $V_p$ and $V_m$ generate entering currents $I_p$ and $I_m$. Current $I_p$ enters into the emitter of transistor $Q_p$ and, ignoring base current, exits from the collector of transistor $Q_p$. Current $I_m$ enters into the emitter of transistor $Q_m$, and, ignoring base current, exits from the collector of transistor $Q_m$. Even if the base currents are not ignored, any effect caused by the base currents would be cancelled due to the symmetry of the circuit.

Because $V_T$ depends on temperature, the values for $I_p$ and $I_m$, which depend upon the value of $V_T$, change with temperature. Because the input transistors $Q_p$ 321 and $Q_m$ 322 are located as close to each other as possible on the substrate of the integrated circuit, $V_T$ for $Q_p$ 321 and $V_T$ for $Q_m$ 322 change with temperature by a same amount. Although the current in each input transistor $Q_p$ 321 and $Q_m$ 322 changes with temperature, the current in each input transistor $Q_p$ 321 and $Q_m$ 322 does not change by a same amount. The current in each input transistor $Q_p$ 321 and $Q_m$ 322 does not change by a same amount because these currents depend not only on temperature but also on the $V_{eb}$ of the emitter-base junction of the respective transistor, following a relation: $I=I_s*\exp(V_{eb}/V_T)$. The $V_{eb}$ of each transistor also depends on the external differential voltage applied to input terminals $V_p$ and $V_m$. If $V_p$ is different from $V_m$, then the $V_{eb}$ of transistor $Q_p$ will be different from the $V_{eb}$ of transistor $Q_m$. Consequently, when temperature changes, the amount by which $I_p$ changes will, in general, be different from the amount by which $I_m$ changes. The factor exp($V_{eb}$) makes $I_p$ and $I_m$ change by different amounts.

The basic output of the temperature-compensated voltage comparator 301 is a $V_{out\_b}$ signal at node 359, which is an analog voltage signal. The $V_{out\_b}$ signal is inverted using a logic inverter cell Inv0 360, to produce a $V_{out}$ digital voltage signal at output terminal 313. Such use of the logic inverter cell Inv0 360 allows the output $V_{out}$ to equal to logical "0" when the differential input voltage ($V_p-V_m$) is smaller than the desired threshold.

The value of the $V_{out\_b}$ signal at node 359 depends on the currents $I_p$__mirrored and $I_m*\exp(c/V_T)$__mirrored, which are indicated in FIG. 3. The derivation of the current $I_m*\exp(c/V_T)$__mirrored is described hereinbelow. If $I_m*\exp(c/V_T)$__mirrored is larger than $I_p$__mirrored, then $V_{out\_b}$ is logical "1" (and $V_{out}$=logical "0"). If $I_m*\exp(c/V_T)$__mirrored is smaller than $I_p$__mirrored, then $V_{out\_b}$ is logical "0" (and $V_{out}$=logical "1"). The threshold of the temperature-compensated voltage comparator 301 is found when $I_m*\exp(c/V_T)$__mirrored is equal to $I_p$__mirrored. This condition may be used to find the differential input voltage, $V_p-V_m$, needed so that $I_m*\exp(c/V_T)$__mirrored=$I_p$__mirrored.

The current $I_m*\exp(c/V_T)$__mirrored is obtained from the current $I_m*\exp(c/V_T)$ by means of the current mirror comprising transistors M2 332 and M3 333. The current $I_m*\exp(c/V_T)$ is obtained from the temperature-compensating circuit 350, the details of which are given during the explanation of FIGS. 4 and 5. The temperature-compensating circuit 350 comprises an input terminal 351 and an output terminal 352. Current enters the temperature-compensating circuit 350 at its input terminal 351 with a forced current, $I_m$, and then exits with a sinking current, $I_m*\exp(c/V_T)$, at its output terminal 352. The temperature-compensating circuit 350 generates the function $I_{out}=I_{in}*\exp(c/V_T)$. Therefore, when $I_{in}$ is equal to $I_m$, $I_{out}=I_m*\exp(c/V_T)$.

Current $I_m$ flows first through the input transistor $Q_m$ 322. Then, a current $I_m$__mirrored is obtained from the current $I_m$ by the second current mirror comprising transistors M4 334 and M5 335. The current $I_m$_mirrored at the drain of transistor M5 335 is the same current $I_m$_mirrored at the drain of transistor M6 336. The current $I_m$_mirrored is mirrored by the third current mirror comprising transistors M6 336 and M7 337 to obtain the current $I_m$ at the drain of transistor M7 337.

Current $I_p$ flows through input transistor $Q_p$ 321. The current $I_p$_mirrored is obtained from the current $I_p$ by means of the first current mirror comprising transistors M0 330 and M1 331.

The condition needed to change the output is the current $I_m*\exp(c/V_T)$_mirrored being equal to the current $I_p$_mirrored. At this condition, which occurs during the transition of $V_{out\_b}$ from "0" to "1", the signal $V_{out\_b}$ has a value of approximately half of $V_{in}$, and both output transistors, M1 331 and M2 332, are operating in the saturation region. This means that the value of current $I_m*\exp(c/V_T)$_mirrored is equal to the value of current $I_m*\exp(c/V_T)$ because of the current mirror formed by transistors M2 332 and M3 333. This also means that the value of current $I_p$_mirrored is equal to the value of current $I_p$ because of the current mirror formed by transistors M0 330 and M1 331. Based on this analysis, it can be said that $I_m*\exp(c/V_T)=I_p$ during the transitioning of $V_{out\_b}$. The condition $I_m*\exp(c/V_T)=I_p$ can be related to the differential input voltage $(V_p-V_m)$ by analyzing the translinear input loop formed by the differential input voltage and the emitter-base junctions of input transistors $Q_p$ 321 and $Q_m$ 322.

By applying Kirchhoff's voltage law, it is possible to find the following equation for the translinear loop comprising $(V_p-V_m)$, $Q_p$ and $Q_m$ at the input of the temperature-compensated voltage comparator 301:

$$V_p - V_m = V_{ebQp} - V_{ebQm} = V_T*\ln(I_p/I_{sp}) - V_T*\ln(I_m/I_{sm}) \quad \text{Equation (5)}$$

where $V_{ebQp}$ is the emitter-base voltage of input transistor $Q_p$ 321; where $V_{ebQm}$ is the emitter-base voltage of input transistor $Q_m$ 322; where $I_p$ is the current through $Q_p$; where $I_m$ is the current through $Q_m$; where $I_{sp}$ and $I_{sm}$ are constant currents used to describe the characteristics of the input transistors $Q_p$ and $Q_m$, respectively, in the saturation region and are directly proportional to the junction area of the respective transistor; where $V_T = kT/q$ is approximately 25.85 mV at 300° K.; and where T is temperature in degrees Kelvin. By applying algebraic and logarithmic identities, Equation (5) can be re-written as $$V_p - V_m = V_T*\ln[(I_p/I_m)*(I_{sm}/I_{sp})]$$

If the area of input transistor $Q_p$ 321 is made equal to the area of input transistor $Q_m$ 322, then $I_{sm}$ is equal to $I_{sp}$, and Equation (5) becomes:

$$V_p - V_m = V_T*\ln[(I_p/I_m)*(1)] \quad \text{Equation (6)}$$

It can be seen from the schematic diagram of the temperature-compensated voltage comparator 301 that, at the threshold, $I_p$ is equal to $I_m*\exp(c/V_T)$, where 'c' is a constant. In which case, Equation (6) can be re-written as:

$V_p - V_m = V_T*\ln[(I_m*\exp(c/V_T)/I_m)*(1)]$, which simplifies to:
$V_p - V_m = V_T*\ln[\exp(c/V_T)]$, which further simplifies to:
$V_p - V_m = V_T*(c/V_T)$, or
$V_p - V_m = c$, which is the result desired, i.e., the differential voltage is not temperature-dependent. In other words, the temperature-compensating circuit 350 cancels, or counteracts, the $V_T$ term of Equation (6) above.

Unlike with the prior art translinear comparator 201, the threshold of the temperature-compensated voltage comparator 301 is non-zero notwithstanding that the input transistors $Q_p$ 321 and $Q_m$ 322 are of equal size, i.e., r=1. In the temperature-compensated voltage comparator 301, the current $I_m$ is propagated and is multiplied by the temperature-compensating circuit 350 by the factor $\exp(c/V_T)$. If $V_p$ is equal to $V_m$, then the current $I_m*\exp(c/V_T)$ at the output node $V_{out\_b}$ 359 will be larger than current $I_p$ at the output node; consequently the voltage at the output node, $V_{out\_b}$, goes "high". Only when $V_p$ is larger than $V_m$ by the quantity 'c', will the current $I_m*\exp(c/V_T)$ be smaller than $I_p$, and consequently $V_{out\_b}$ goes "low".

Figure 4:
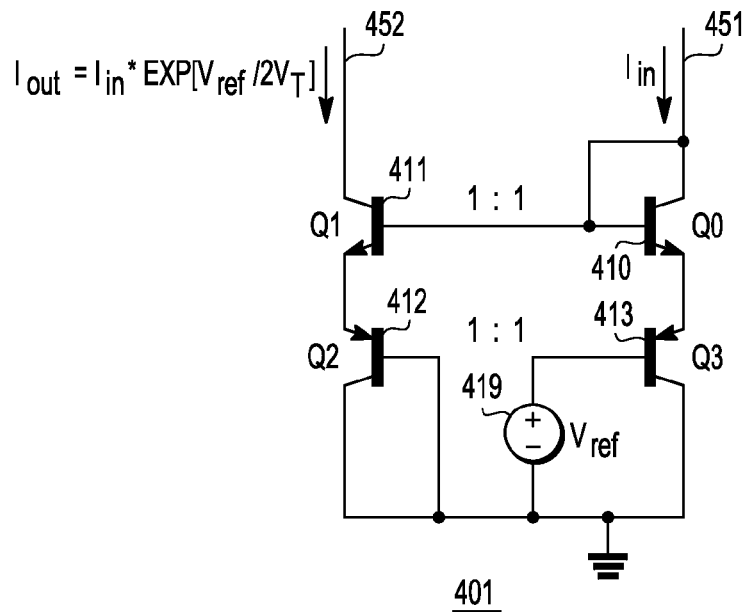
FIG. 4 is a schematic diagram of a translinear loop in accordance with one embodiment of the temperature-compensating circuit of FIG. 3.

FIG. 4 is a schematic diagram of one embodiment of a translinear loop 401 that can perform the function of the temperature-compensating circuit 350. The translinear loop 401 has an input 451 and an output 452. The translinear loop 401 comprises transistor Q0 410 and Q1 411, wherein the bases of transistors Q0 and Q1 are coupled together. The collector of Q0 410 is coupled to the base of Q0. The translinear loop 401 also comprises transistor Q2 412 and Q3 413, wherein the base of transistors Q2 is coupled to ground and wherein the base of Q3 is coupled to a reference voltage $V_{ref}$ 419. The ratio of the junction area of transistor Q0 to the junction area of transistor Q1 is 1:1. Also, the ratio of the junction area of transistor Q2 to the junction area of transistor Q3 is 1:1. The reference voltage $V_{ref}$ 419 is a zero thermal coefficient (ZTC) reference, which is typically available on integrated circuits. In an exemplary embodiment, the value of $V_{ref}$ is approximately 60 mV. The translinear loop 401 is used to obtain the expression $I_{out} = I_{in}*\exp(c/V_T)$. The function $I_{out} = I_{in}*\exp(c/V_T)$ can be realized in different forms, and, basically, all the forms are implementations of translinear loops. In the embodiment of the translinear loop 401 shown in FIG. 4, bipolar junction transistors are used; alternatively, other transistor implementations are used to attain similar results. From the schematic diagram of the translinear loop 401 shown in FIG. 4, it can be seen that $$V_{be1} + V_{eb2} = V_{ref} + V_{eb3} + V_{be0},$$

where $V_{be1}$ is the base-emitter voltage of transistor Q1 411, $V_{eb2}$ is the emitter-base voltage of transistor Q2 412, $V_{eb3}$ is the emitter-base voltage of transistor Q3 413, and $V_{be0}$ is the base-emitter voltage of transistor Q0 410.

For the translinear loop 401, it can be shown that $$V_S*\ln(I_{out}/I_{s1}) + V_T*\ln(I_{out}/I_{s2}) = V_{ref} + V_T*\ln(I_{in}/I_{s3}) + V_T*\ln(I_{in}/I_{s0}),$$

where $I_{s1}$, $I_{s2}$, $I_{s3}$, and $I_{s0}$ are the saturation currents of transistors Q1 411, Q2 412, Q3 413 and Q0 410, respectively. Using algebraic and logarithmic identities, the above equation becomes $$V_T*\ln[(I_{out}/I_{in})(I_{s0}/I_{s1})] + V_T*\ln[(I_{out}/I_{in})(I_{s3}/I_{s2})] = V_{ref}$$

Because $I_{s0} = I_{s1}$ and $I_{s2} = I_{s3}$, the above equation simplifies to $$V_T*\ln[(I_{out}/I_{in})] + V_T*\ln[(I_{out}/I_{in})] = V_{ref},$$

which further simplifies as follows:

$$2V_T*\ln[I_{out}/I_{in}] = V_{ref}$$

$$\ln[I_{out}] - \ln[\text{pi } I_{in}] = V_{ref}/2V_T$$

$$I_{out} = I_{in}*\exp[V_{ref}/(2V_T)]$$

$$I_{out} = I_{in}*\exp[c/V_T],$$

where, for the translinear circuit 401, $c = V_{ref}/2$, which is a constant independent of temperature when $V_{ref}$ is the ZTC reference. Consequently, the threshold of the temperature-compensated voltage comparator 301 is a constant with respect to temperature, and the value of this constant is generated by the translinear circuit 401. The threshold of the comparator 301 and 601 (see FIG. 6), can be changed by changing the value of $V_{ref}$ in the translinear circuit 401.

Figure 5:
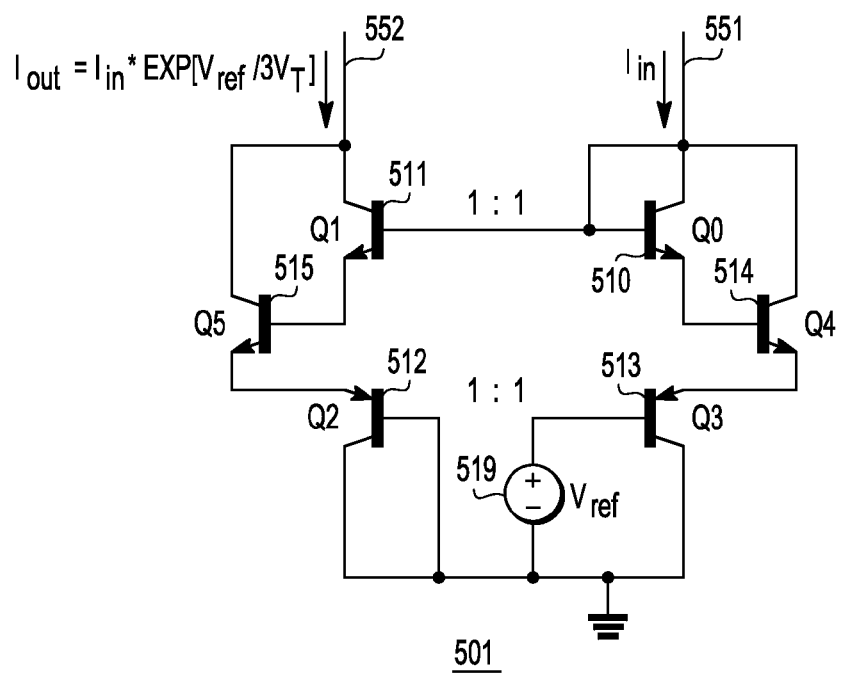
FIG. 5 is a schematic diagram of another translinear loop in accordance with another embodiment of the temperature-compensating circuit of FIG. 3.

FIG. 5 is a schematic diagram of another embodiment of a translinear loop 501 that can perform the function of the temperature-compensating circuit 350. The threshold of the translinear loop 501 is different from the threshold of the translinear loop 401. The translinear loop 501 has a threshold of $V_{ref}/3$, which is lower than the threshold of $V_{ref}/2$ of the translinear loop 401. The translinear loop 501 accomplishes the threshold of $V_{ref}/3$ without changing the value of $V_{ref}$. The translinear loop 501 has an input 551 and an output 552. The translinear loop 501 comprises a first Darlington pair which comprises transistor Q1 510 and Q4 514 coupled to a second Darlington pair which comprises transistors Q1 511 and Q5 515, wherein the bases of transistors Q0 and Q1 are coupled together. The collector of Q1 511 is coupled to the collector of Q5 515. The collector of Q0 510 is coupled to its base and to the collector of Q4 514. The translinear loop 501 also comprises transistor Q2 512 and Q3 513, wherein the base of transistor Q2 is coupled to ground and wherein the base of Q3 is coupled to a reference voltage $V_{ref}$ 519. The ratio of emitter junction areas is 1:1 for the three pairs of transistors: Q2/Q3, Q5/Q4 and Q1/Q0. The translinear loop 501 of FIG. 5 uses the aforementioned first and second Darlington pairs to obtain a different ratio between $I_{out}$ and $I_{in}$, than that obtained by the translinear loop 401 of FIG. 4. For example, for the translinear loop 501 of FIG. 5, $$V_{be1}+V_{be5}+V_{eb2}=V_{ref}+V_{be0}+V_{be4}+V_{eb3}$$

Also, for the translinear loop 501 of FIG. 5, $$V_T*\ln(I_{out}/I_{s5})+V_T*\ln[I_{out}/(\beta I_{s1})]+V_T*\ln(I_{out}/I_{s2})=V_{ref}+V_T*\ln(I_{in}/I_{s4})+V_T*\ln[I_{in}/(\beta I_{s0})]+V_T*\ln(I_{in}/I_{s3}),$$

where $\beta$ is the current gain from the base current to the collector current of Q0 and of Q1. With $I_{s0}=I_{s1}$, $I_{s4}=I_{s5}$ and $I_{s2}=I_{s3}$, the preceding equation becomes:

$$V_T*\ln(I_{out}/I_{in})+V_T*\ln[I_{out}/I_{in}]+V_T*\ln(I_{out}/I_{in})=V_{ref}$$

Therefore, $$I_{out}=I_{in}*\exp[V_{ref}/(3V_T)]$$

$$I_{out}=I_{in}*\exp[c/V_T]$$

where, for the translinear circuit 501, $c=V_{ref}/3$, which is a constant independent of temperature when $V_{ref}$ is the ZTC reference.

Figure 6:
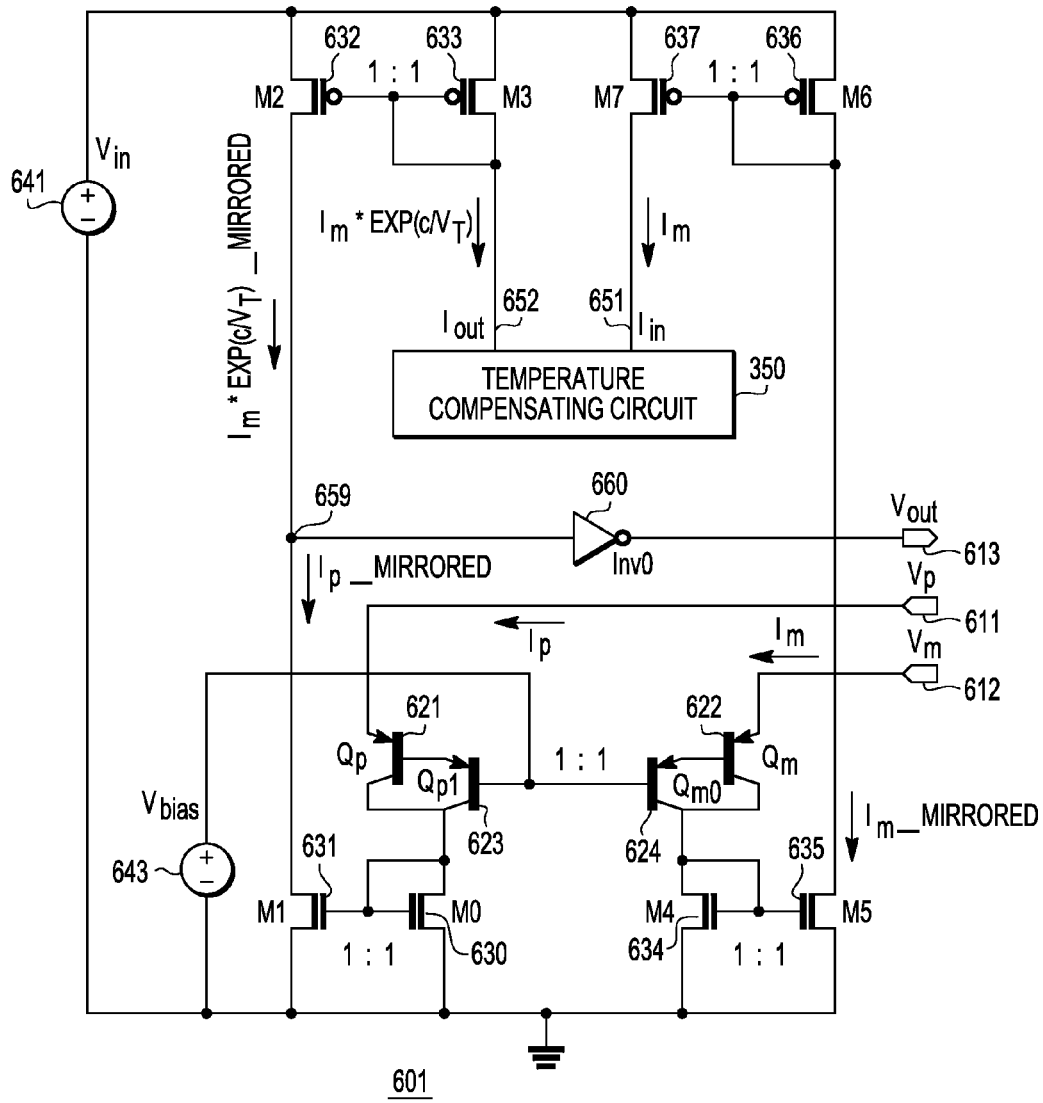
FIG. 6 is a schematic diagram of a temperature-compensated voltage comparator in accordance with another embodiment of the invention, which includes a temperature-compensating circuit.

FIG. 6 is a schematic diagram of a temperature-compensated voltage comparator 601 in accordance with another embodiment of the invention. It is possible to vary the input transistors from those of the temperature-compensated voltage comparator 301 of FIG. 3, to obtain a different mathematical expression for translinear input voltage loop. The temperature-compensated voltage comparator 601 of FIG. 6 uses a Darlington pair at the input, and obtains a different mathematical expression for the translinear input voltage loop.

The temperature-compensated voltage comparator 601 comprises input terminals 611 and 612 and output terminal 613. The temperature-compensated voltage comparator 601 also comprises input transistors $Q_p$ 621 and $Q_m$ 622. The temperature-compensated voltage comparator 601 further comprises transistor $Q_{p1}$ 623 coupled to input transistor $Q_p$ 621 in a Darlington configuration, and transistor $Q_{m0}$ 624 coupled to input transistor $Q_m$ 622 in a Darlington configuration. The collector of input transistor $Q_p$ 621 is coupled to the collector of transistor $Q_{p1}$ 623, and the base of input transistor $Q_p$ 621 is coupled to the emitter of $Q_{p1}$ 623. The collector of input transistor $Q_m$ 622 is coupled to the collector of transistor $Q_{m0}$ 624, and the base of input transistor $Q_m$ 622 is coupled to the emitter of $Q_{m0}$ 624. In an exemplary embodiment, input transistors $Q_p$ 621 and $Q_m$ 622 are PNP bipolar junction transistors. The emitter of input transistor $Q_p$ 621 is coupled to input terminal 611. The emitter of input transistor $Q_m$ 622 is coupled to input terminal 612. The base of transistor $Q_{p1}$ 623 is coupled to the base of transistor $Q_{m0}$ 624. The temperature-compensated voltage comparator 601 further comprises N-channel transistors M0 630 and M1 631, which are arranged in a current-mirror configuration, wherein their gates are coupled together. The temperature-compensated voltage comparator 601 also comprises N-channel transistors M4 634 and M5 635 that are arranged in a current-mirror configuration, wherein their gates are coupled together. The collector of input transistor $Q_p$ 621 is coupled to the drain of transistor M0 630. The collector of input transistor $Q_m$ 622 is coupled to the drain of transistor M4 634. The temperature-compensated voltage comparator 601 further comprises P-channel transistors M2 632 and M3 633, and P-channel transistors M6 636 and M7 637, in which each pair is arranged in a current-mirror configuration, in which the gates of each transistor of a pair are coupled together. The ratio of all current mirrors is 1:1. The drain of M2 632 is coupled to the drain of M1 631, and the drain of M6 636 is coupled to the drain of M5 635. In an exemplary embodiment, transistors M0 630, M1 631, M2 632, M3 633, M4 634, M5 635, M6 636 and M7 637 are field-effect transistors (FETs). The temperature-compensated voltage comparator 601 includes a power supply having a voltage $V_{in}$ 641. In an exemplary embodiment, the value of $V_{in}$ 641 is approximately 3.6V. A bias voltage $V_{bias}$ 643 is used to bias the base of transistors $Q_{p1}$ 623 and $Q_{m0}$ 624. In an exemplary embodiment, the value of $V_{bias}$ 643 is approximately equal to $V_p$ minus the voltage drop of two diodes. The temperature-compensated voltage comparator 601 includes the temperature-compensating circuit 350.

With the temperature-compensating circuit 601 of FIG. 6, the threshold can be changed without changing $V_{ref}$.

The temperature-compensated voltage comparator 601 of FIG. 6 follows the following relation:

$$V_{out} = \begin{cases} 0, & \text{if}(V_p - V_m) < aT*\ln(b) \\ 1, & \text{if}(V_p - V_m) > aT*\ln(b) \end{cases}$$

where 'a' is a universal physical constant ($a=2k/q\approx17.33\times10^{-2}$ mV/degree Kelvin); 'b' is a function dependent on temperature, and T is the junction temperature of transistors measured in degrees Kelvin. For the temperature-compensated voltage comparator 601, the equation for the input translinear loop is:

$$V_p-V_m=V_T*\ln(I_p/I_{sp})+V_T*\ln[I_p/(\beta I_{sp1})]-V_T*\ln(I_m/I_{sm})-V_T*\ln[I_m/(\beta I_{sm0})].$$

where $\beta$ is the current gain from the base current to the collector current of $Q_{p1}$ and $Q_{m0}$.

With $I_{sp}=I_{sm}$ and $I_{sp1}=I_{sp0}$, the preceding equation becomes:

$$V_p-V_m=V_T*\ln(I_p/I_m)+V_T*\ln(I_p/I_m)=2V_T*\ln(I_p/I_m)$$

For temperature-compensated voltage comparator 601 of FIG. 6, the constant 'a', as defined in Equation (1), is multiplied twice (compared to the constant 'a' obtained for the temperature-compensated voltage comparator 301 of FIG. 3) because each of the input currents $I_p$ and $I_m$ passes through two PN junctions.

Because the temperature-compensated voltage comparator 601 of FIG. 6 shares many features with the temperature-compensated voltage comparator 301 of FIG. 3, some of these shared features were not repeated in the foregoing description of temperature-compensated voltage comparator 601.

Figure 7:
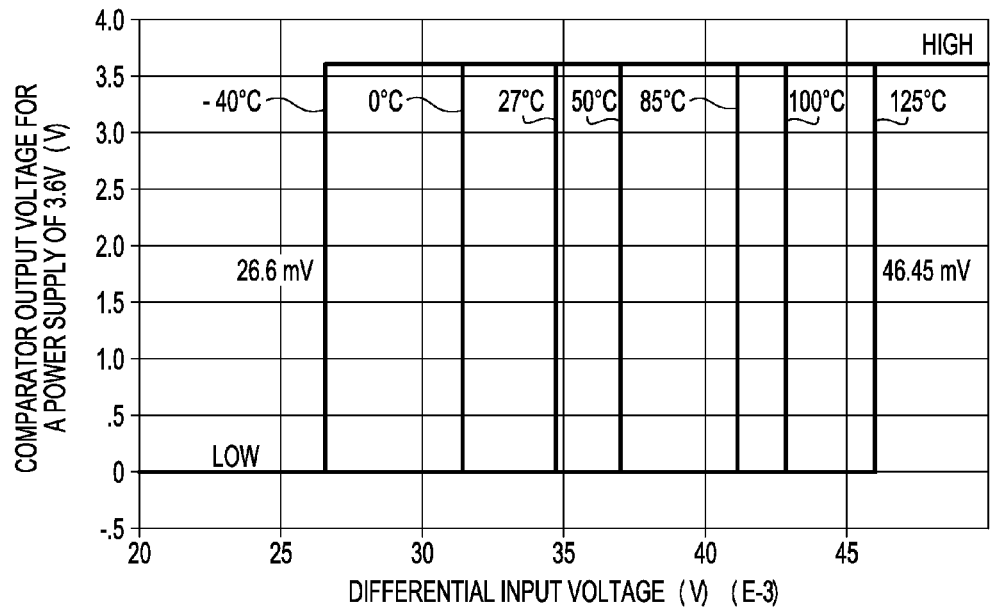
FIG. 7 is a chart of output voltage versus differential input voltage of the prior art differential voltage translinear comparator of FIG. 2, for various temperatures.

The prior art comparator 201 was simulated. FIG. 7 shows simulation results conducted at −40° C., 0° C., 27° C., 85° C., 100° C. and 125° C. for the prior art comparator 201. The simulations show a threshold varying between 26.6 mV and 46.45 mV when temperature varies from −40° C. to +125° C. (while also taking into consideration variation with process and mismatch). Disadvantageously, the threshold varies ±27% around a medium value of 36.5 mV. The chart in FIG. 7 represents the output of the comparator versus the differential input voltage for each of the above-mentioned temperatures. The output of the comparator is one of logical "0", which is the ground of the circuit, and logical "1", which is at the voltage of the power supply of the circuit, $V_{in}$. When the differential input voltage reaches the threshold, the output voltage of the comparator changes from logical "0" to logical "1". In the particular cases shown in FIGS. 7 and 8, the logical "1" value is 3.6V, because $V_{in}$ is 3.6V.

Figure 8:
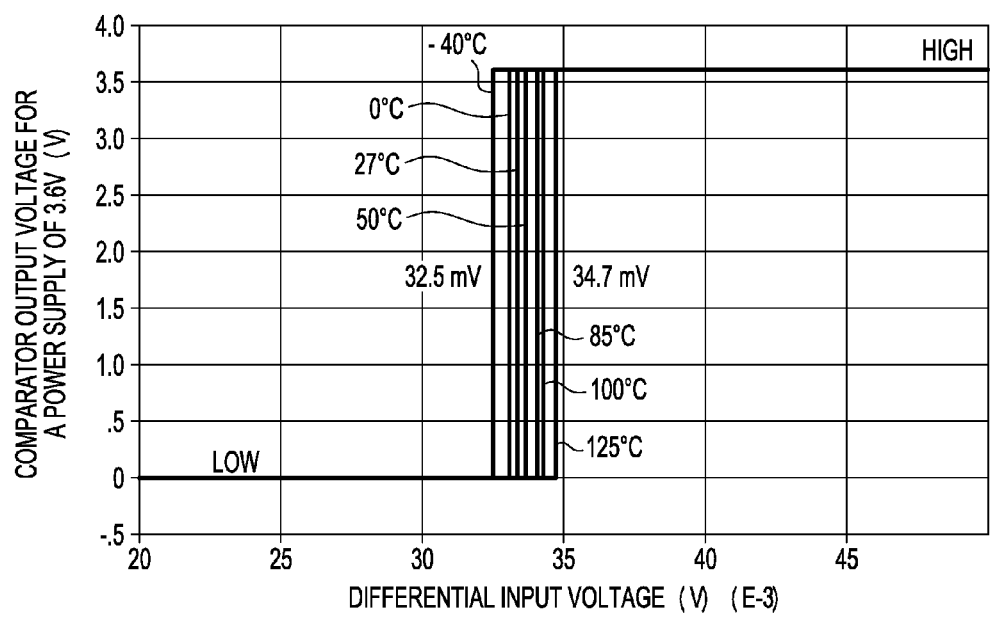
FIG. 8 is a chart of output voltage versus differential input voltage of the temperature-compensated voltage comparator of FIG. 3 when used with the translinear loop of FIG. 5, for various temperatures.

The circuits shown in FIGS. 3 and 5 were simulated. FIG. 8 is a chart of output voltage versus differential input voltage of the temperature-compensated voltage comparator 301 when used with the translinear loop 501, for various temperatures. FIG. 8 shows simulation results conducted at −40° C., 0° C., 27° C., 85° C., 100° C. and 125° C. for the temperature-compensated comparator 301. The simulations show a threshold varying between 32.5 mV and 34.7 mV when temperature varies from −40° C. to +125° C. (while also taking into consideration variation with process and mismatch). The threshold varies merely ±3% around a medium value of 33.6 mV. The threshold is defined using the ZTC reference.

The circuits shown in FIG. 3 and FIG. 5 were implemented, and preliminary experimental results agree with the simulation results. The circuits were tested at room temperature (approximately 23° C.), at a lower temperature (approximately −10° C.) and at a higher temperature (approximately +120° C.) using a cooling spray and a heat gun, respectively. The experimental threshold obtained was approximately 33 mV, with a variation of ±4.5%.

The temperature-compensated voltage comparator 301 and 601 is used to compare low differential voltages (for example, between 30 mV and 50 mV) with a fixed reference. Advantageously, in the temperature-compensated voltage comparator 301 and 601, no extra currents are generated to compensate for any changes in temperature that may occur. In the temperature-compensated voltage comparator 301 and 601, the currents used in the method of temperature compensation are the same currents used for the voltage differential comparison. The currents used for the voltage differential comparison are the input currents, $I_p$ and $I_m$. The input currents, $I_p$ and $I_m$, are also used in the method of temperature compensation because 1) $I_p$ propagates to the output 313 and 613 through bipolar junction transistor $Q_p$, through the first current mirror comprising transistors M0 330 and M1 331 and through logic inverter cell Inv0 360; and 2) $I_m$ propagates to the output 313 and 613, but is first "processed" in the temperature-compensating circuit 350 to obtain the current $I_m*\exp(c/V_T)$.

The temperature-compensated voltage comparator 301 and 601 compares two currents ($I_p$ and $I_m$) that originate from a translinear input loop. One of the currents ($I_m$) is processed logarithmically (to produce $I_m*\exp(c/V_T)$) to cancel the thermal dependency of the currents ($I_m$ and $I_p$) being compared at the threshold. Only the current $I_m$ is processed.

The transistors comprising every current mirror in FIGS. 3-6 are matched. In an integrated circuit layout, every pair of matched transistors in FIGS. 3-6 is located as close to each other as feasible so that both transistors of each pair have a same temperature during operation, and so that any process variations would affect both transistors of each pair in a same way.

The temperature-compensated voltage comparator 301 and 601 can compare low differential voltages without using complex techniques such as a technique that uses switched capacitors. The temperature-compensated voltage comparator 301 and 601 uses a continuous-time method, and has a faster response than a differential voltage comparator that uses switched capacitors, which is a discrete-time method.

When temperature-compensated comparator 301 and 601 is used to measure the differential voltage across the sense resistor of a buck converter, the limiting of the maximum peak current of the buck converter is not affected by temperature.

Figure 1:
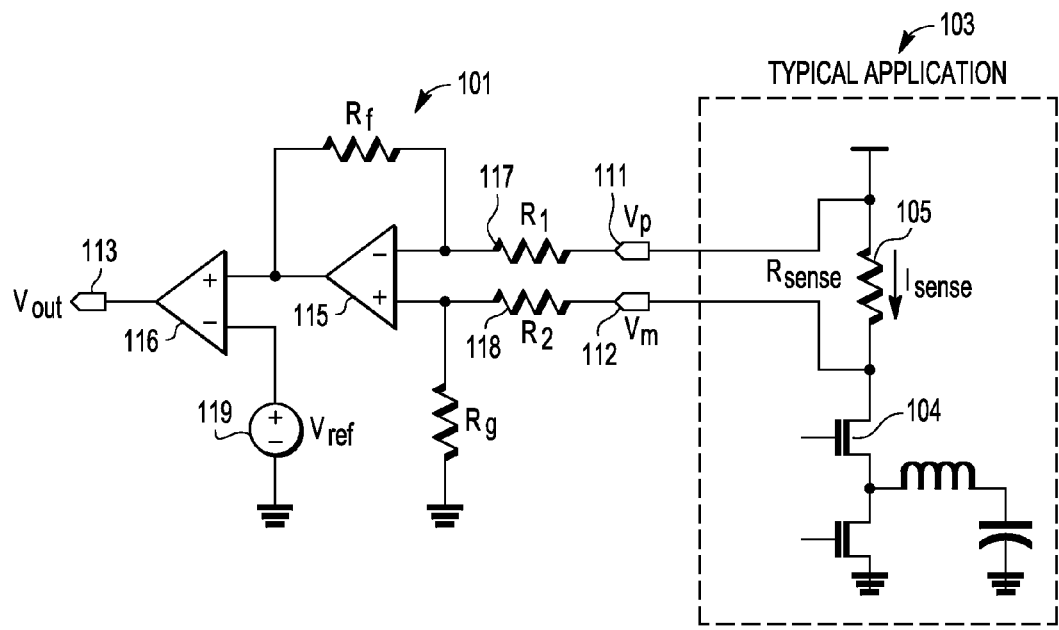
FIG. 1 illustrates a schematic diagram of a prior art voltage comparator and a typical application.
Figure 2:
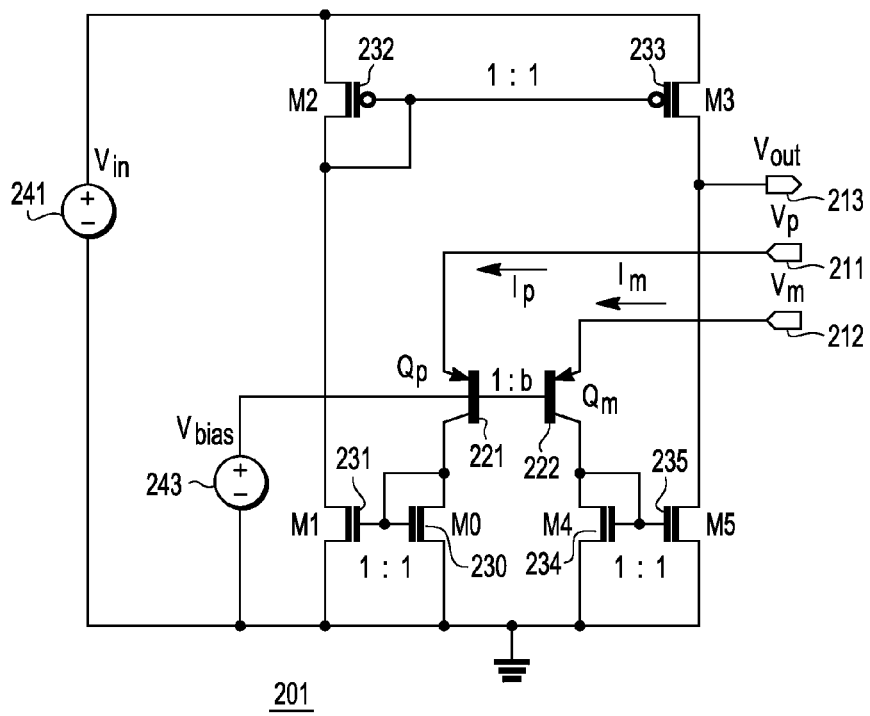
FIG. 2 is a schematic diagram of a prior art differential voltage translinear comparator.

A power supply includes a control module (not shown) that is operatively coupled to the temperature-compensated comparator 301 and 601 and operatively coupled to a switching regulator such as the buck converter 103 shown in FIG. 1. The control module performs logical operations using, inter alia, the digital output voltage $V_{out}$ of the temperature-compensated comparator 301 and 601, to control operation of the power supply. The control module comprises hardware, software or a combination of hardware and software.

In one exemplary embodiment, the temperature-compensated voltage comparator 301 and 601 is disposed on an integrated circuit fabricated using a complementary metal oxide semiconductor (CMOS) process.

Although the invention is described herein with reference to specific embodiments, various modifications and changes can be made without departing from the scope of the present invention as set forth in the claims below. For instance, although the exemplary embodiments show that the temperature-compensated voltage comparator 301 and 601 is disposed on an integrated circuit, the invention is equally usable when constructed entirely of components consisting of discrete devices. The invention is not limited to use with a buck converter; the invention is usable with other types of application. Although the exemplary embodiments show the temperature-compensated voltage comparator 301 and 601 being used with a buck converter, which is a step-down DC-to-DC converter, the invention can also be used with a step-up DC-to-DC converter, or with any switching regulator. Although the temperature-compensated voltage comparator 301 and 601 is shown measuring a voltage generated by current flowing through a resistor, the invention can be used to measure any two voltages. Although the temperature-compensated voltage comparator 301 and 601 is shown being used with a power supply that has a buck converter, the invention is equally applicable for use with a low-dropout regulator or with a linear regulator. Although the exemplary embodiments show that the temperature-compensated voltage comparator 301 and 601 comprises FETs and BJTs, all the transistors of the temperature-compensated voltage comparator can be BJTs. Although in one exemplary embodiment, the temperature-compensated voltage comparator is disposed on an integrated circuit fabricated using CMOS technology; the invention can also be used with an integrated circuit fabricated using other technologies.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A temperature-compensated voltage comparator, comprising:
   a first input terminal and a second input terminal for receiving, for comparison, a first input voltage and a second input voltage, respectively;
   a first bipolar junction transistor and a second bipolar junction transistor for converting the first input voltage and the second input voltage to a first input current and a second input current, respectively, wherein the first input current and the second input current are dependent upon temperature;
   a temperature-compensating circuit for generating a logarithmic temperature-compensating factor, wherein the logarithmic temperature-compensating factor compensates, at least in part, for temperature dependency of the first input current and the second input current, the temperature-compensating circuit including:
   an input for receiving the second input current, and
   an output for outputting a temperature-compensated current, wherein the temperature-compensated current is the second input current multiplied by the logarithmic temperature-compensating factor; and
   a basic output node for summing the temperature-compensated current and the first input current, wherein a basic output voltage at the basic output node is indicative of a differential between the first input voltage and the second input voltage.

2. The temperature-compensated voltage comparator of claim 1, including a logic inverter cell, coupled to the basic output node, for providing a digital output voltage indicative of a polarity of the differential between the first input voltage and the second input voltage.

3. The temperature-compensated voltage comparator of claim 1, wherein the temperature-compensated voltage comparator has a threshold of:

$$aT*\ln(b),$$

where 'a' is a universal physical constant, 'b' is a function dependent on temperature, and T is a junction temperature of the first bipolar junction transistor and the second bipolar junction transistor measured in degrees Kelvin.

4. The temperature-compensated voltage comparator of claim 3, wherein $$b=e^{c/(aT)},$$

where 'e' is Euler's constant and 'c' is a constant independent of temperature that determines a threshold of the temperature-compensated voltage comparator.

5. The temperature-compensated voltage comparator of claim 4, wherein the logarithmic temperature-compensating factor is $\exp(c/V_T)$, where $V_T$ is a thermal voltage of the first bipolar junction transistor and the second bipolar junction transistor.

6. The temperature-compensated voltage comparator of claim 1, wherein the temperature-compensating circuit includes a translinear loop for generating the temperature-compensating factor.

7. The temperature-compensated voltage comparator of claim 6, including a zero thermal coefficient reference $V_{ref}$, and wherein the translinear loop performs an operation: $I_{out}=I_{in}*\exp(V_{ref}/2V_T)$, where is the current at the input of the temperature-compensating circuit, $I_{out}$ is the current at the output of the temperature-compensating circuit, and $c=V_{ref}/2$.

8. The temperature-compensated voltage comparator of claim 6, including a zero thermal coefficient reference $V_{ref}$, and wherein the translinear loop performs an operation: $I_{out}=I_{in}*\exp(V_{ref}/3V_T)$, where $I_{in}$ is the current at the input of the temperature-compensating circuit, $I_{out}$ is the current at the output of the temperature-compensating circuit, and $c=V_{ref}/3$.

9. The temperature-compensated voltage comparator of claim 1, wherein the temperature-compensated voltage comparator is fabricated on a single integrated circuit substrate, and wherein the first bipolar junction transistor, the second bipolar junction transistor and the temperature-compensating circuit share a same thermal environment.

10. The temperature-compensated voltage comparator of claim 1, wherein the temperature-compensating circuit further includes:
   a first transistor having a collector coupled to the input of the temperature-compensating circuit and a second transistor having a collector coupled to the output of the temperature-compensating circuit, wherein their bases are coupled together, and wherein a collector of first transistor is coupled to its base,
   a third transistor having an emitter coupled to an emitter of the second transistor, wherein a base and a collector of the third transistor are coupled to ground, and
   a fourth transistor having an emitter coupled to an emitter of the first transistor, wherein a collector of the fourth transistor is coupled to ground, and a base of the fourth transistor is coupled to a zero thermal coefficient reference voltage.

11. A power supply, comprising:
   a switching regulator, the switching regulator including a current sense resistor;
   a temperature-compensated voltage comparator, coupled to the current sense resistor, for comparing a voltage across the current sense resistor, the temperature-compensated voltage comparator, further comprising:
   a first input terminal and a second input terminal for receiving, for comparison, a first input voltage and a second input voltage, respectively,
   a first bipolar junction transistor and a second bipolar junction transistor for converting the first input voltage and the second input voltage to a first input current and a second input current, respectively, wherein the first input current and the second input current are dependent upon temperature,
   a temperature-compensating circuit for generating a logarithmic temperature-compensating factor, wherein the logarithmic temperature-compensating factor compensates, at least in part, for temperature dependency of the first input current and the second input current, the temperature-compensating circuit including:
   an input for receiving the second input current, and an output for outputting a temperature-compensated current, wherein the temperature-compensated current is the second input current multiplied by the logarithmic temperature-compensating factor;

a digital output voltage derived from the temperature-compensated current and the first input current, wherein the digital output voltage is indicative of a polarity of a differential between the first input voltage and the second input voltage; and a control module, coupled to the switching regulator and to the temperature-compensated voltage comparator, for using the digital output voltage to control operation of the power supply.

12. The power supply of claim 11, wherein the temperature-compensated voltage comparator has a threshold of:

$aT*\ln(b)$, where 'a' is a universal physical constant, 'b' is a function dependent on temperature, and T is a junction temperature of the first bipolar junction transistor and the second bipolar junction transistor measured in degrees Kelvin.

13. The power supply of claim 12, wherein $b=e^{c/(aT)}$, where 'e' is Euler's constant and 'c' is a constant independent of temperature that determines a threshold of the temperature-compensated voltage comparator.

14. The power supply of claim 13, wherein the logarithmic temperature-compensating factor is $\exp(c/V_T)$, where $V_T$ is a thermal voltage of the first bipolar junction transistor and the second bipolar junction transistor.

15. The power supply of claim 14, including a zero thermal coefficient reference $V_{ref}$, and wherein the temperature-compensating circuit performs an operation: $I_{out}=I_{in}*\exp(V_{ref}/2V_T)$, where $I_{in}$ is the current at the input of the temperature-compensating circuit, $I_{out}$ is the current at the output of the temperature-compensating circuit, and $c=V_{ref}/2$.

16. The power supply of claim 14, including a zero thermal coefficient reference $V_{ref}$, and wherein the temperature-compensating circuit performs an operation: $I_{out}=I_{in}*\exp(V_{ref}/3V_T)$, where $I_{in}$ is the current at the input of the temperature-compensating circuit, $I_{out}$ is the current at the output of the temperature-compensating circuit, and $c=V_{ref}/3$.

17. A temperature-compensated voltage comparator, comprising:

a first input terminal and a second input terminal for receiving, for comparison, a first input voltage and a second input voltage, respectively;

a first bipolar junction transistor and a second bipolar junction transistor for converting the first input voltage and the second input voltage to a first input current and a second input current, respectively, wherein the first input current and the second input current are dependent upon temperature;

a first current mirror, coupled to the first bipolar junction transistor, for producing a mirror of the first input current;

a second current mirror, coupled to the second bipolar junction transistor, for producing a mirror of the second input current;

a third current mirror, coupled to the second current mirror, for producing, from the mirror of the second input current, another appearance of the second input current;

a temperature-compensating circuit for generating a logarithmic temperature-compensating factor, wherein the logarithmic temperature-compensating factor compensates, at least in part, for temperature dependency of the first input current and the second input current, the temperature-compensating circuit including:

an input for receiving, from the third current mirror, the second input current, and an output for outputting a temperature-compensated current, wherein the temperature-compensated current is the second input current multiplied by the logarithmic temperature-compensating factor;

a fourth current mirror, coupled to the output of the temperature-compensating circuit, for producing, from the temperature-compensated current, a mirror of the temperature-compensated current; and a basic output node, coupled to the fourth current mirror and to the first current mirror, for summing the temperature-compensated current and the first input current, wherein a basic output voltage at the basic output node is indicative of a differential between the first input voltage and the second input voltage.

18. The temperature-compensated voltage comparator of claim 17, wherein the temperature-compensated voltage comparator has a threshold of:

$aT*\ln(b)$, where 'a' is a universal physical constant, 'b' is a function dependent on temperature, and T is a junction temperature of the first bipolar junction transistor and the second bipolar junction transistor measured in degrees Kelvin.

19. The temperature-compensated voltage comparator of claim 18, wherein $b=e^{c/(aT)}$, where 'e' is Euler's constant and 'c' is a constant independent of temperature that determines a threshold of the temperature-compensated voltage comparator.

20. The temperature-compensated voltage comparator of claim 19, wherein the temperature-compensating factor is $\exp(c/V_T)$, where $V_T$ is a thermal voltage of the first bipolar junction transistor and the second bipolar junction transistor, wherein the first bipolar junction transistor, the second bipolar junction transistor and the temperature-compensating circuit share a same thermal environment.

* * * * *

UNITED STATES PATENT AND TRADEMARK OFFICE
CERTIFICATE OF CORRECTION

| | | |
|---|---|---|
| PATENT NO. | : 7,843,231 B2 | Page 1 of 1 |
| APPLICATION NO. | : 12/426585 | |
| DATED | : November 30, 2010 | |
| INVENTOR(S) | : Angel Maria Gomez Arguello | |

It is certified that error appears in the above-identified patent and that said Letters Patent is hereby corrected as shown below:

Col. 14, in claim 7, line 11, after "where", insert --$I_{in}$--.

Signed and Sealed this
Eighth Day of February, 2011

David J. Kappos
*Director of the United States Patent and Trademark Office*